United States Patent
Takeda et al.

(10) Patent No.: US 8,395,210 B2
(45) Date of Patent: Mar. 12, 2013

(54) DMOS TRANSISTOR AND METHOD OF MANUFACTURING THE SAME

(75) Inventors: Yasuhiro Takeda, Ogaki (JP); Seiji Otake, Kumagaya (JP); Shuichi Kikuchi, Oizumi-machi (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 106 days.

(21) Appl. No.: 12/680,012

(22) PCT Filed: Sep. 26, 2008

(86) PCT No.: PCT/JP2008/068113
§ 371 (c)(1),
(2), (4) Date: Mar. 25, 2010

(87) PCT Pub. No.: WO2009/041741
PCT Pub. Date: Apr. 2, 2009

(65) Prior Publication Data
US 2010/0193865 A1   Aug. 5, 2010

(30) Foreign Application Priority Data

Sep. 28, 2007  (JP) ................. 2007-255092

(51) Int. Cl.
*H01L 29/78* (2006.01)
*H01L 21/336* (2006.01)
(52) U.S. Cl. ............... 257/335; 438/302; 257/E21.417; 257/E29.261
(58) Field of Classification Search ............... 257/335, 257/E21.417, E29.261; 438/302
See application file for complete search history.

(56) References Cited

U.S. PATENT DOCUMENTS

| 4,904,613 | A | * | 2/1990 | Coe et al. .................... 438/268 |
| 5,827,774 | A | | 10/1998 | Kitajima |
| 6,022,778 | A | | 2/2000 | Contiero et al. |
| 6,043,532 | A | | 3/2000 | Depetro et al. |
| 6,194,278 | B1 | | 2/2001 | Rengarajan |
| 6,369,425 | B1 | * | 4/2002 | Ferla et al. .................... 257/341 |
| 7,115,946 | B2 | | 10/2006 | Kawaguchi et al. |
| 7,485,924 | B2 | | 2/2009 | Takimoto et al. |
| 2003/0173620 | A1 | * | 9/2003 | Yasuhara et al. .............. 257/335 |
| 2007/0057321 | A1 | | 3/2007 | Kikuchi et al. |
| 2007/0148926 | A1 | * | 6/2007 | Datta et al. .................... 438/510 |

FOREIGN PATENT DOCUMENTS

JP   8-321556   12/1996
JP   9-320978   12/1997

(Continued)

OTHER PUBLICATIONS

International Search Report mailed Oct. 28, 2008, directed to counterpart PCT/JP2008/068113; 4 pages.

*Primary Examiner* — Calvin Lee
*Assistant Examiner* — Monica D Harrison
(74) *Attorney, Agent, or Firm* — Morrison & Foerster LLP

(57) ABSTRACT

The invention provides a DMOS transistor in which a leakage current is decreased and the source-drain breakdown voltage of the transistor in the off state is enhanced when a body layer is formed by oblique ion implantation. After a photoresist layer 18 is formed, using the photoresist layer 18 and a gate electrode 14 as a mask, first ion implantation is performed toward a first corner portion 14C1 on the inside of the gate electrode 14 in a first direction shown by an arrow A'. A first body layer 17A' is formed by this first ion implantation. The first body layer 17A' is formed so as to extend from the first corner portion 14C1 to under the gate electrode 14, and the P-type impurity concentration of the body layer 17A' in the first corner portion 14C1 is higher than that of a conventional transistor.

8 Claims, 12 Drawing Sheets

FOREIGN PATENT DOCUMENTS

| | | |
|---|---|---|
| JP | 10-233508 | 9/1998 |
| JP | 11-111728 | 4/1999 |
| JP | 2001-77360 | 3/2001 |
| JP | 2002-110970 | 4/2002 |
| JP | 2003-502862 | 1/2003 |
| JP | 2004-39773 | 2/2004 |
| JP | 2007-27641 | 2/2007 |
| JP | 2007-67181 | 3/2007 |
| JP | 2007-80919 | 3/2007 |

\* cited by examiner (A)

(B)

(A)

(B)

DMOS TRANSISTOR AND METHOD OF MANUFACTURING THE SAME

REFERENCE TO RELATED APPLICATIONS

This application is a national stage application under 35 USC 371 of International Application No. PCT/JP2008/068113, filed Sep. 26, 2008, which claims priority from Japanese Patent Application No. 2007-255092, filed Sep. 28, 2007, the contents of which prior application are incorporated herein by reference.

FIELD OF THE INVENTION

The invention relates to a DMOS transistor and a method of manufacturing the same.

BACKGROUND OF THE INVENTION

A DMOS transistor is a MOS field effect transistor in which a source layer and a body layer to be a channel are formed by double diffusion, and is used as a power semiconductor device for a power supply circuit, a driver circuit, etc.

In recent years, there is a need to decrease the on-resistance of a DMOS transistor for a demand for smaller electronics and lower power consumption. Therefore, pitches between transistors are decreased by using a micro-fabrication technique so as to increase the number of transistors per unit area. Furthermore, lower on-resistance is realized by decreasing the channel length of a transistor by forming a body layer by an oblique ion implantation technique instead of by thermal diffusion that has been employed conventionally.

Hereafter, a structure of an N channel type lateral DMOS transistor and a method of manufacturing the same will be described referring to FIGS. 12 and 13. FIG. 12 is a plan view showing a pattern of a lateral DMOS transistor, and FIG. 13 is cross-sectional views of FIG. 12, in which FIG. 13(A) is a cross-sectional view of FIG. 12 along line X-X and FIG. 13(B) is a cross-sectional view of FIG. 12 along line Y-Y.

An N type source layer 11 is formed in the front surface of an N type semiconductor substrate 10 (e.g. a silicon single crystal substrate). The source layer 11 is made of an N type layer 11A and an N+ type layer 11B of which the concentration is higher than that of the N type layer 11A.

Furthermore, a gate insulation film 12 and an insulation film 13 for electric field reduction (a LOCOS film) connected to the gate insulation film 12 are formed next to the source layer 11 on the front surface of the semiconductor substrate 10, and a gate electrode 14 (e.g. made of a polysilicon film) is formed from on this gate insulation film 12 onto a portion of the insulation film 13 for electric field reduction. This gate electrode 14 is formed so as to surround the source layer 11 like a ring, and the source layer 11 is exposed from the tetragonal opening of the ring-like gate electrode 14. Furthermore, a spacer film 15 (e.g. made of a silicon oxide film) is formed on the sidewall of the gate electrode 14, and the high concentration N+ type layer 11B of the source layer 11 is formed by using this spacer film 15.

Furthermore, an N+ type drain layer 16 is formed in the front surface of the semiconductor substrate 10. The drain layer 16 is disposed apart from the source layer 11, and the insulation film 13 for electric field reduction is disposed between these.

Furthermore, a P type body layer 17 is formed so as to be partially superposed on the source layer 11 and extend in the front surface of the semiconductor substrate 10 under the gate electrode 14. When a voltage applied to the gate electrode 14 is a threshold voltage or more, the front surface of this body layer 17 is inverted to N type to form a conductive channel between the source layer 11 and the drain layer 16.

Hereafter, a method of forming the body layer 17 will be described. A photoresist layer 18 is formed so as to have ends on the gate electrode 14 and cover the insulation film 13 for electric field reduction and the drain layer 16.

The source layer 11 and an end of the gate electrode 14 abutting the source layer 11 are exposed from the photoresist layer 18. Oblique ion implantation of P-type impurities is performed in four directions shown by allows A, B, C and D in FIG. 12. In detail, ion beams are applied to the front surface of the semiconductor substrate 10 in oblique directions relative to the vertical direction by using the gate electrode 14 and the photoresist layer 18 as a mask.

This oblique ion implantation realizes the formation of the body layer 17 in a narrow region under the gate electrode 14, thereby decreasing the channel length of the transistor and achieving lower on-resistance.

A DMOS transistor is described in Japanese Patent Application publication Nos. hei 10-233508 and 2004-039773, for example.

SUMMARY OF THE INVENTION

In the oblique ion implantation described above, due to the shadowing effect of the gate electrode 14 and the photoresist layer 18, it is difficult to implant ions in the corner portions on the inside of the gate electrode 14 and the impurity concentration of the body layer 17 is lower in these portions. This phenomenon is prominent when the aspect ratios of the gate electrode 14 and the photoresist layer 18 are increased when the DMOS transistor is formed by a micro-fabrication technique.

As a result, in the corner portions on the inside of the gate electrode 14 the impurity concentration of the body layer 17 is locally lower to provide a lower threshold voltage, and a problem occurs such that a leakage current between the source layer 11 and the drain layer 16 increases and the source-drain breakdown voltage of the transistor in the off state decreases in these portions.

A method of manufacturing a DMOS transistor of the invention is made to solve the problem described above. In the method of manufacturing the DMOS transistor including a semiconductor substrate, a source layer of a first conductive type formed in a front surface of the semiconductor substrate, a gate insulation film formed on the front surface of the semiconductor substrate, a gate electrode formed on the gate insulation film so as to surround the source layer like a ring, a body layer of a second conductive type superposed on the source layer and extending in the front surface of the semiconductor substrate to under the gate electrode, and a drain layer of the first conductive type formed for the source layer in the front surface of the semiconductor substrate, a process of forming the body layer includes a process of performing ion implantation of impurities of the second conductive type to the front surface of the semiconductor substrate toward corner portions on an inside of the gate electrode.

In this method of manufacturing the DMOS transistor, since the process of forming the body layer includes the process of performing the ion implantation of impurities of the second conductive type to the front surface of the semiconductor substrate toward the corner portions on the inside of the gate electrode, the local decrease of the impurity concentration of the body layer in the corner portions is minimized. This decreases a leakage current and enhances the source-drain breakdown voltage of the transistor in the off state.

Furthermore, a DMOS transistor of the invention includes: a semiconductor substrate; a source layer of a first conductive type formed in a front surface of the semiconductor substrate; a gate insulation film formed on the front surface of the semiconductor substrate; a gate electrode formed on the gate insulation film so as to surround the source layer like a ring; a body layer of a second conductive type superposed on the source layer and extending in the front surface of the semiconductor substrate to under the gate electrode; and a drain layer of the first conductive type formed for the source layer on the front surface of the semiconductor substrate, wherein impurity concentration of the body layer is lower in corner portions on an inside of the gate electrode, and the source layer is apart from the corner portions.

In this DMOS transistor, since the impurity concentration of the body layer is lower in the corner portions on the inside of the gate electrode and the source layer is formed apart from the corner portions, the local decrease of the impurity concentration of the body layer in the corner portions is minimized and a parasitic transistor having a low threshold voltage is prevented from operating. Therefore, a leakage current is decreased, and the source-drain breakdown voltage of the transistor in the off state is enhanced. A leakage current of a parasitic transistor in the corner portions is shown by a broken lined arrow in FIG. 12.

In the DMOS transistor and the method of manufacturing the same of the invention, when a body layer is formed by oblique ion implantation, a leakage current between a source layer and a drain layer is decreased and the source-drain breakdown voltage of a transistor in the off state is enhanced.

DETAILED DESCRIPTION OF THE INVENTION

[First Embodiment]

Figure 1:
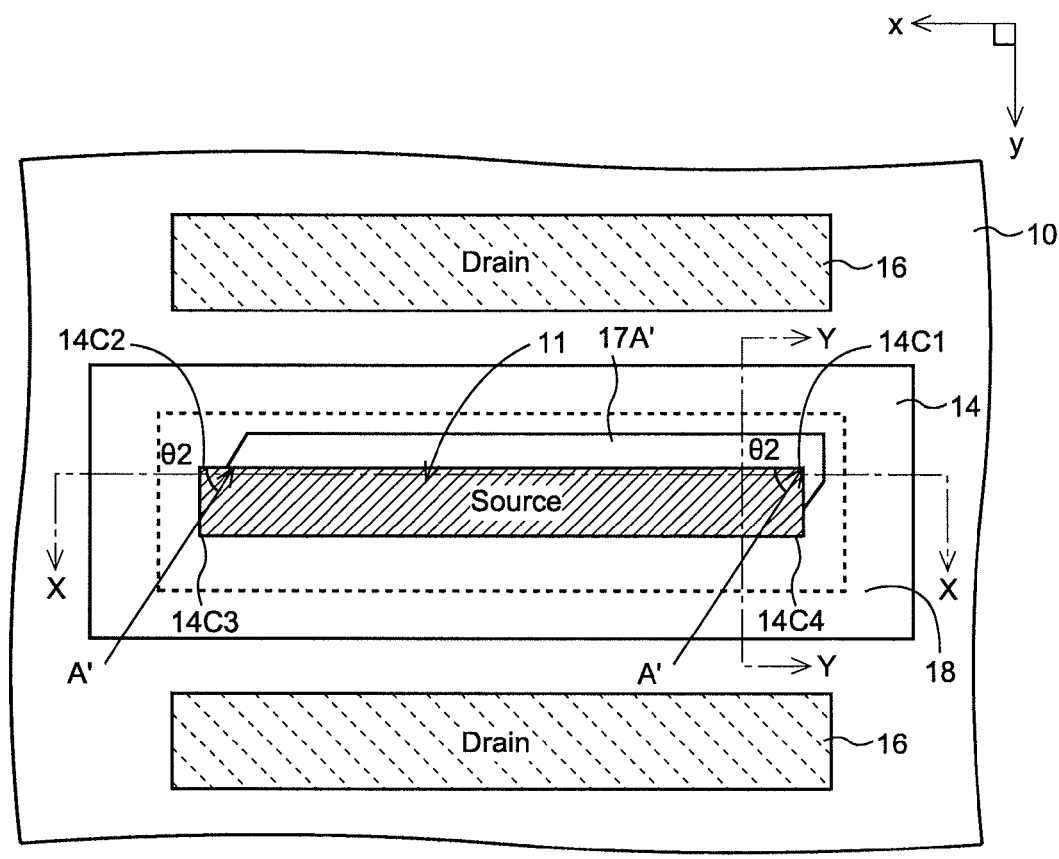
FIG. 1 is a plan view for explaining a DMOS transistor and a method of manufacturing the same of a first embodiment of the invention.
Figure 2:
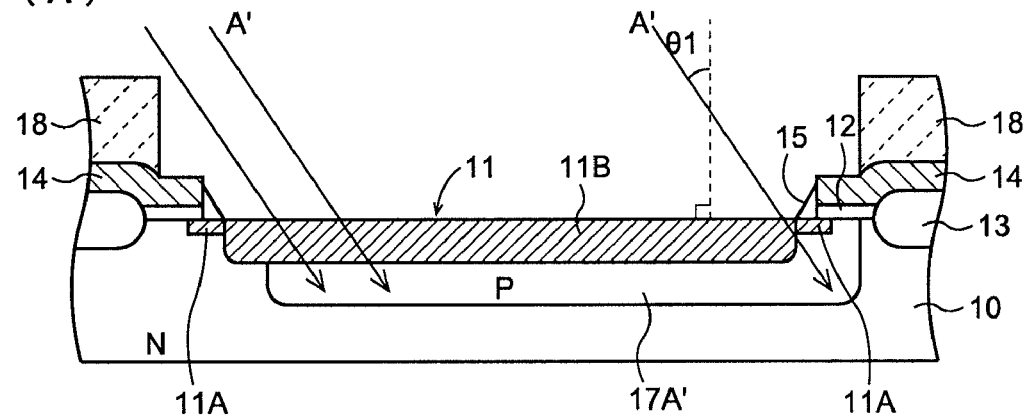
FIG. 2 is cross-sectional views of the DMOS transistor of FIG. 1.
Figure 2:
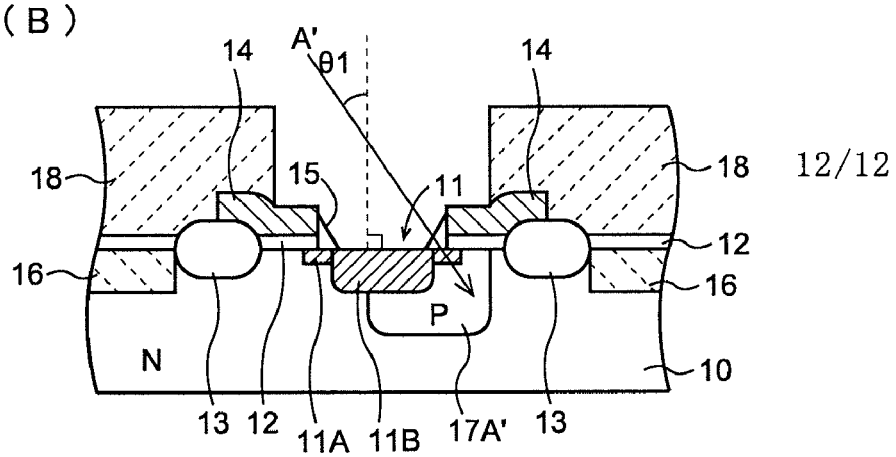

Hereafter, a lateral DMOS transistor (hereafter, referred to as a DMOS transistor) and a method of manufacturing the same of a first embodiment will be described. FIG. 1 is a plan view showing a pattern of the DMOS transistor, and FIG. 2 is cross-sectional views of FIG. 1, in which FIG. 2(A) is a cross-sectional view of FIG. 1 along line X-X and FIG. 2(B) is a cross-sectional view of FIG. 1 along line Y-Y. The same numerals are given to the same components as the components in FIGS. 1 and 2, and the description of these is omitted.

A feature of the method of manufacturing the DMOS transistor of the invention is a process of forming a body layer 17 in which ion implantations are performed toward corner portions on the inside of a gate electrode. In detail, as shown in FIGS. 1 and 2, after a photoresist layer 18 is formed, using the photoresist layer 18 and the gate electrode 14 as a mask, first ion implantation of P-type impurities (e.g. boron or BF2) is performed toward a first corner portion 14C1 on the inside of the gate electrode 14 in a first direction shown by an arrow A'. A P type first body layer 17A' is formed by this first ion implantation. The first body layer 17A' is partially superposed on the source layer 11 and extends from the first corner portion 14C1 to under the gate electrode 14, and the P-type impurity concentration of the body layer 17A' in the first corner portion 14C1 is higher than that of the conventional transistor.

Figure 3:
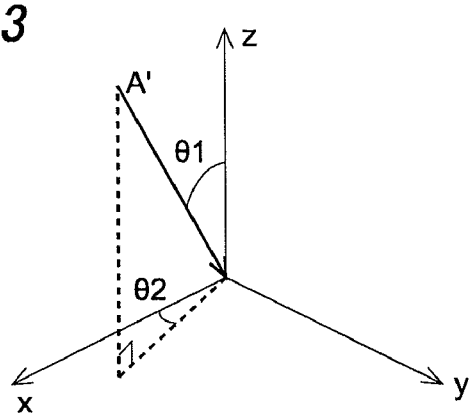
FIG. 3 is a graph showing a direction of oblique ion implantation.

This first ion implantation is performed by inclining the ion implantation direction by a first angle $\theta 1$ relative to the vertical direction (in the z direction in FIG. 3) to the front surface (main surface) of the semiconductor substrate 10 and by a second angle $\theta 2$ relative to the longitudinal direction of the gate electrode 14 (in the x direction in the figure). (see FIGS. 1, 2 and 3)

It is preferable for preventing channeling that the first angle $\theta 1$ ranges from 20° to 45° ($20° \leq \theta 1 \leq 45°$), and the second angle $\theta 2$ ranges from 15° to 40° ($15° \leq \theta 2 \leq 40°$) or from 50° to 75° ($50° \leq \theta 2 \leq 75°$). More preferably, for preventing channeling, the longitudinal direction (the x direction) or the transverse direction (the y direction that makes a right angle with the x direction) of the gate electrode 14 are aligned with the <110> direction of the semiconductor substrate 10 (a silicon single crystal wafer) having an orientation flat on the (110) plane.

Furthermore, while the dose and acceleration energy of the first ion implantation are determined by taking into account the properties of the transistor such as the threshold etc, in a typical case (boron is used as ions, the thickness of the gate insulation film 12 is 7 nm, and the threshold is 1.0V) the dose is $4 \times 10^{12} \sim 5 \times 10^{12}/cm^2$ and the acceleration energy is 70 keV.

Figure 4:
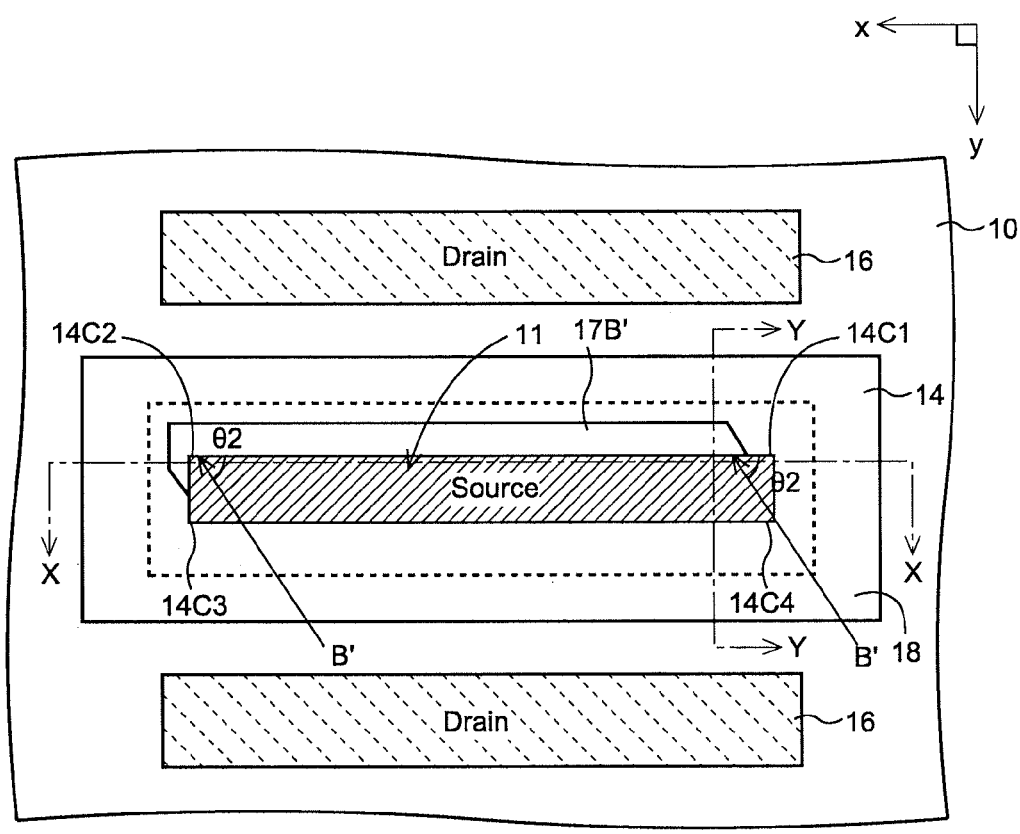
FIG. 4 is a plan view for explaining the DMOS transistor and the method of manufacturing the same of the first embodiment of the invention.
Figure 5:
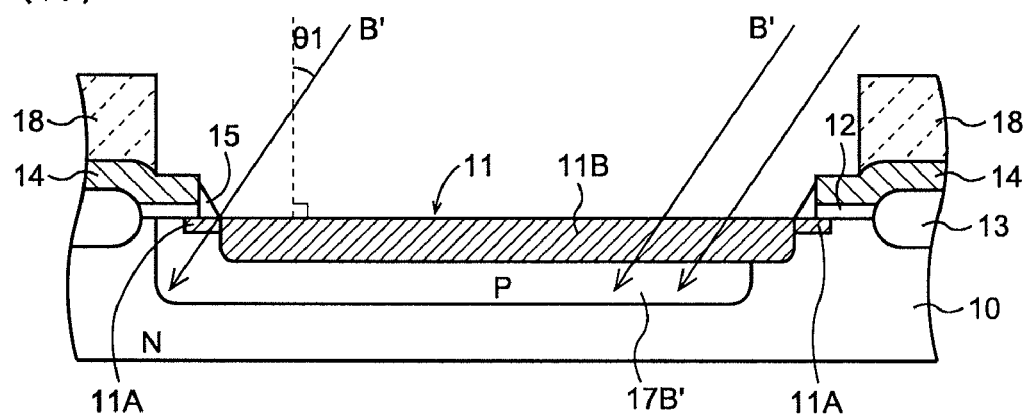
FIG. 5 is cross-sectional views of the DMOS transistor of FIG. 4.
Figure 5:
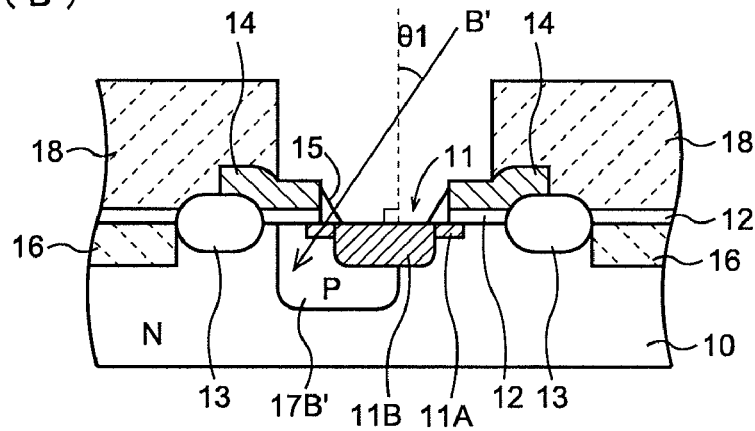

In this first ion implantation, a second corner portion 14C2 next to the first corner portion 14C1, and a third corner portion 14C3 and a fourth corner portion 14C4 on the opposite side are not subjected to the ion implantation due to the shadowing effect of the photoresist layer 18 and the gate electrode 14. Therefore, next second ion implantation is performed. In detail, the second ion implantation is performed under the same conditions as those of the first ion implantation after the semiconductor substrate 10 (a wafer) is turned as shown in FIGS. 4 and 5. FIG. 4 is a plan view showing a pattern of the DMOS transistor, and FIG. 5 is cross-sectional views of FIG. 4, in which FIG. 5(A) is a cross-sectional view of FIG. 4 along line X-X and FIG. 5(B) is a cross-sectional view of FIG. 4 along line Y-Y.

The second ion implantation is performed toward the second corner portion 14C2 on the inside of the gate electrode 14 in a second direction shown by an arrow B'. A second body layer 17B' is formed by this second ion implantation. The second body layer 17B' is formed so as to extend from the second corner portion 14C2 to under the gate electrode 14, and the P-type impurity concentration of the second body layer 17B' in the second corner portion 14C2 is higher than that of the conventional transistor. A first angle θ1 and a second angle θ2 in this ion implantation are preferably equivalent to those of the first ion implantation.

Figure 7:
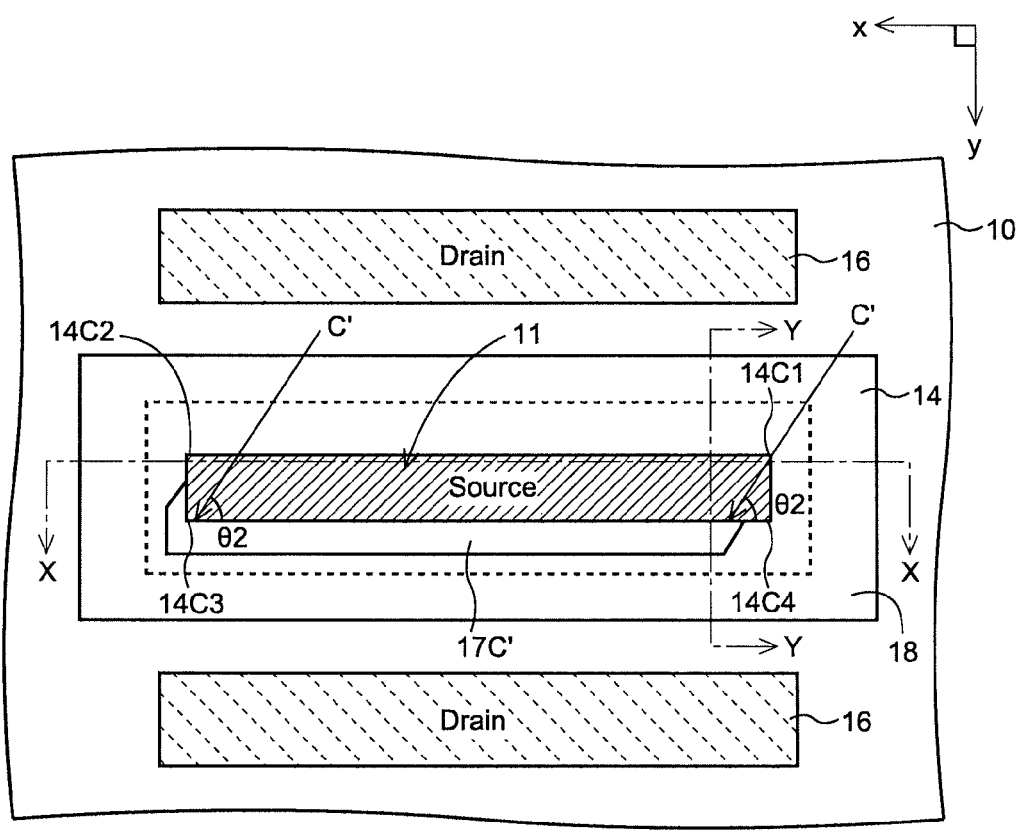
FIG. 7 is a plan view for explaining the DMOS transistor and the method of manufacturing the same of the first embodiment of the invention.
Figure 8:
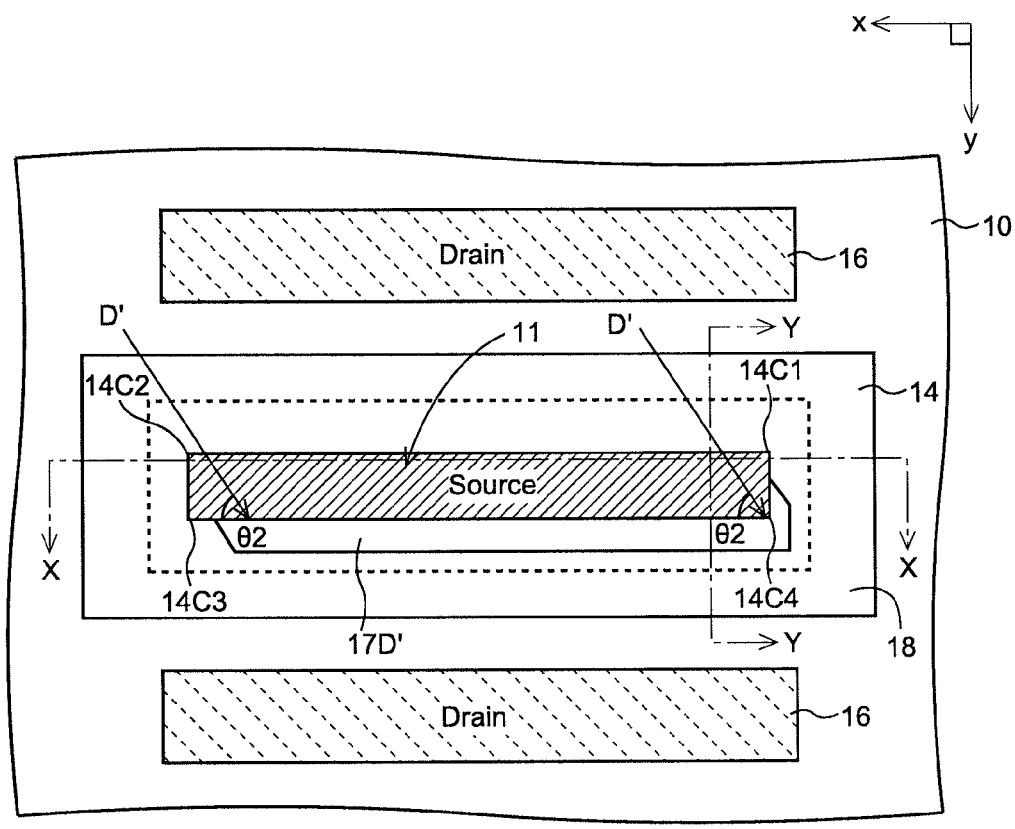
FIG. 8 is a plan view for explaining the DMOS transistor and the method of manufacturing the same of the first embodiment of the invention.

In the similar manner, as shown in FIG. 7, third ion implantation is performed toward the third corner portion 14C3 in a third direction shown by an arrow C' to form a third body layer 17C'. Furthermore, in the similar manner, as shown in FIG. 8, fourth ion implantation is performed toward the fourth corner portion 14C4 in a fourth direction shown by an arrow D' to form a fourth body layer 17D'. By thus performing the four ion implantations toward the four corner portions on the inside of the gate electrode 14, the body layer 17 is made of the first to fourth body layers 17A' to 17D'. Since the impurity concentration of the body layer 17 in the four corner portions is higher than that of the conventional transistor, a leakage current between the source layer 11 and the drain layer 16 is decreased and the source-drain breakdown voltage of the transistor in the off state is enhanced.

Although omitted in the figures, the photoresist layer 18 is removed after the body layer 17 is formed, and then an interlayer insulation film is formed on the whole surface. Contact holes are then formed in the interlayer insulation film on the source layer 11, the gate electrode 14 and the drain layer 16, and wirings are formed through the contact holes respectively so as to contact the source layer 11, the gate electrode 14 and the drain layer 16.

[Second Embodiment]

Figure 6:
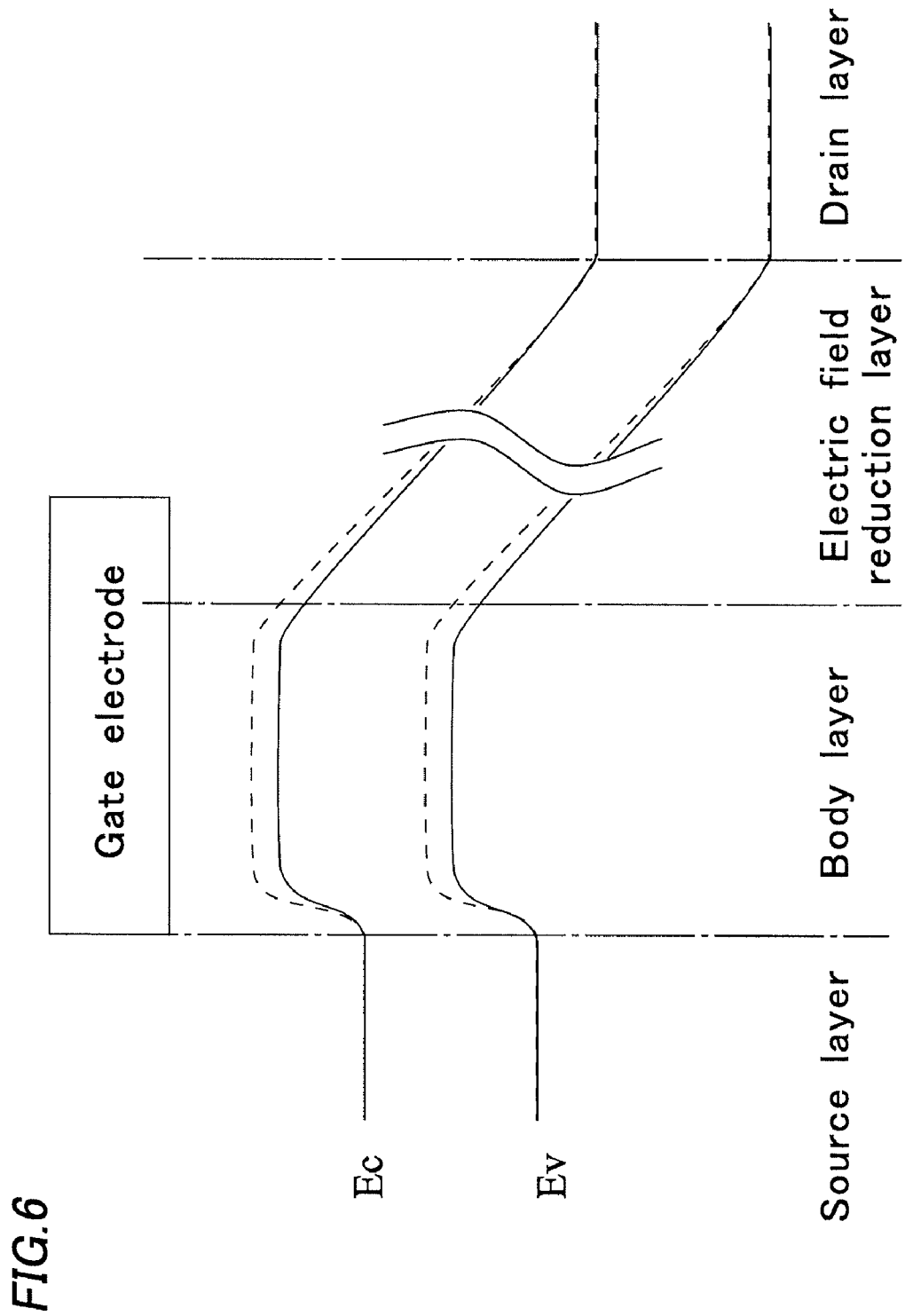
FIG. 6 is a graph schematically showing the energy band state of the DMOS transistor in the off state in the first embodiment of the invention.

In the first embodiment, while the impurity concentration of the body layer 17 in the corner portions on the inside of the gate electrode 14 is higher than that of the conventional transistor as described above, the following problem occurs. This will be described referring to FIG. 6. FIG. 6 schematically shows the energy band state of the DMOS transistor in the off state. The energy band state of a parasitic transistor in the corner portion where the body layer 17 is formed by only one implantation is shown by a solid line, and the energy band state of the transistor in the normal portion where the body layer 17 is formed by two ion implantations is shown by a broken line. When the doses of the ion implantations are respectively the same, the impurity concentration of the body layer 17 in the corner portion is half of the impurity concentration in the normal portion. As a result, the threshold voltage of the parasitic transistor in the corner portion is lower than that of the transistor in the normal portion. When the thickness of the gate insulation film 12 is 7 nm, the impurity concentration of the body layer 17 that is necessary to prevent a leakage current in the corner portion is about $5 \times 10^{17}/cm^3 \sim 1 \times 10^{18}/cm^3$ in the corner portion and about $10^{18}/cm^3 \sim 10^{19}/cm^3$ in the normal portion. The threshold voltage in the normal portion in this case exceeds 1 V, and there is a limitation in decreasing the threshold voltage.

Figure 9:
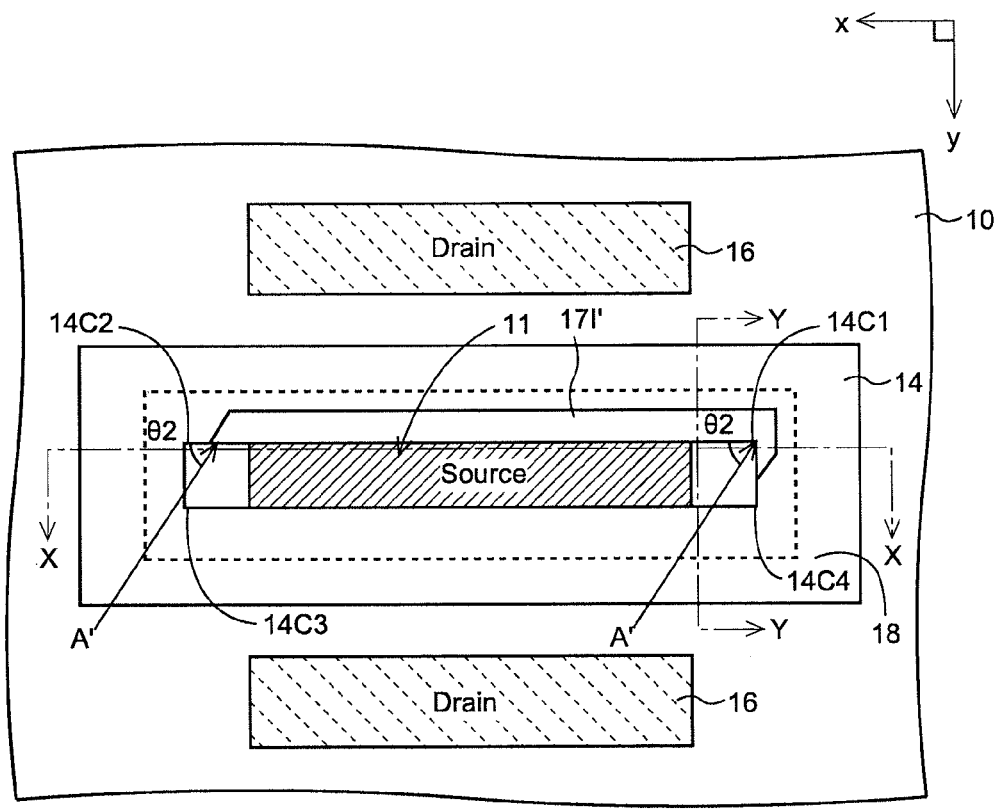
FIG. 9 is a plan view for explaining a DMOS transistor and a method of manufacturing the same of a second embodiment of the invention.
Figure 10:
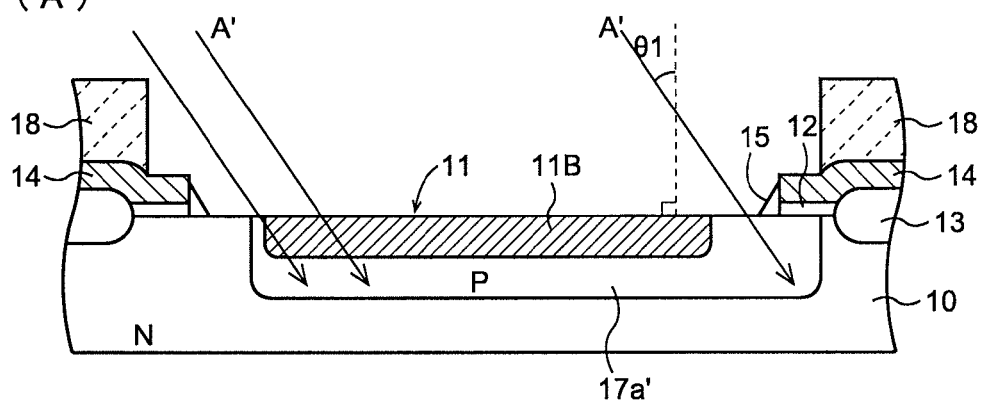
FIG. 10 is cross-sectional views of the DMOS transistor of FIG. 9.
Figure 10:
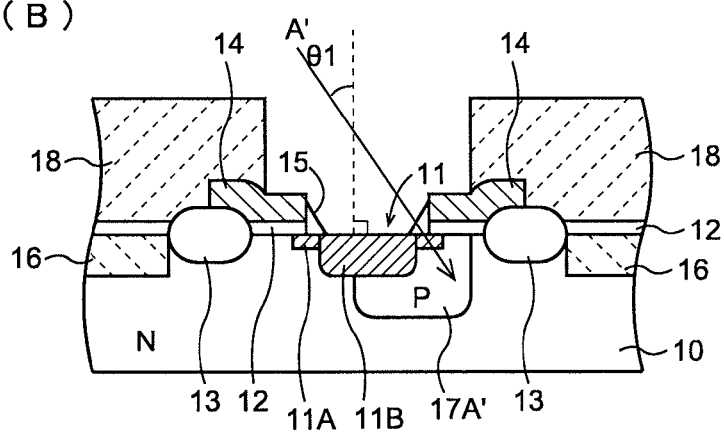

Therefore, in this embodiment, as shown in FIGS. 9 and 10, the source layer 11 is formed apart from the first to fourth corner portions 14C1 to 14C4 where the impurity concentration of the body layer 17 is lower by the oblique ion implantations. In detail, the source layer 11 is recessed toward the inside of the region surrounded by the gate electrode 14, being apart from the first to fourth corner portions 14C1 to 14C4.

FIG. 9 is a plan view showing a pattern of the DMOS transistor, and FIG. 10 is cross-sectional views of FIG. 9, in which FIG. 10(A) is a cross-sectional view of FIG. 9 along line X-X and FIG. 10(B) is a cross-sectional view of FIG. 9 along line Y-Y. FIGS. 9 and 10 show only a structure formed by first ion implantation performed toward the first corner portion 14C1. Following the first ion implantation, second to fourth ion implantations are performed in the similar manner to the first embodiment.

Although the distances between the source layer 11 and the first to fourth corner portions 14C1 to 14C4 depend on the thicknesses of the gate electrode 14 and the photoresist layer 18 and the aspect ratios of these, in a typical case these are preferably 1 to 2 μm.

Figure 11:
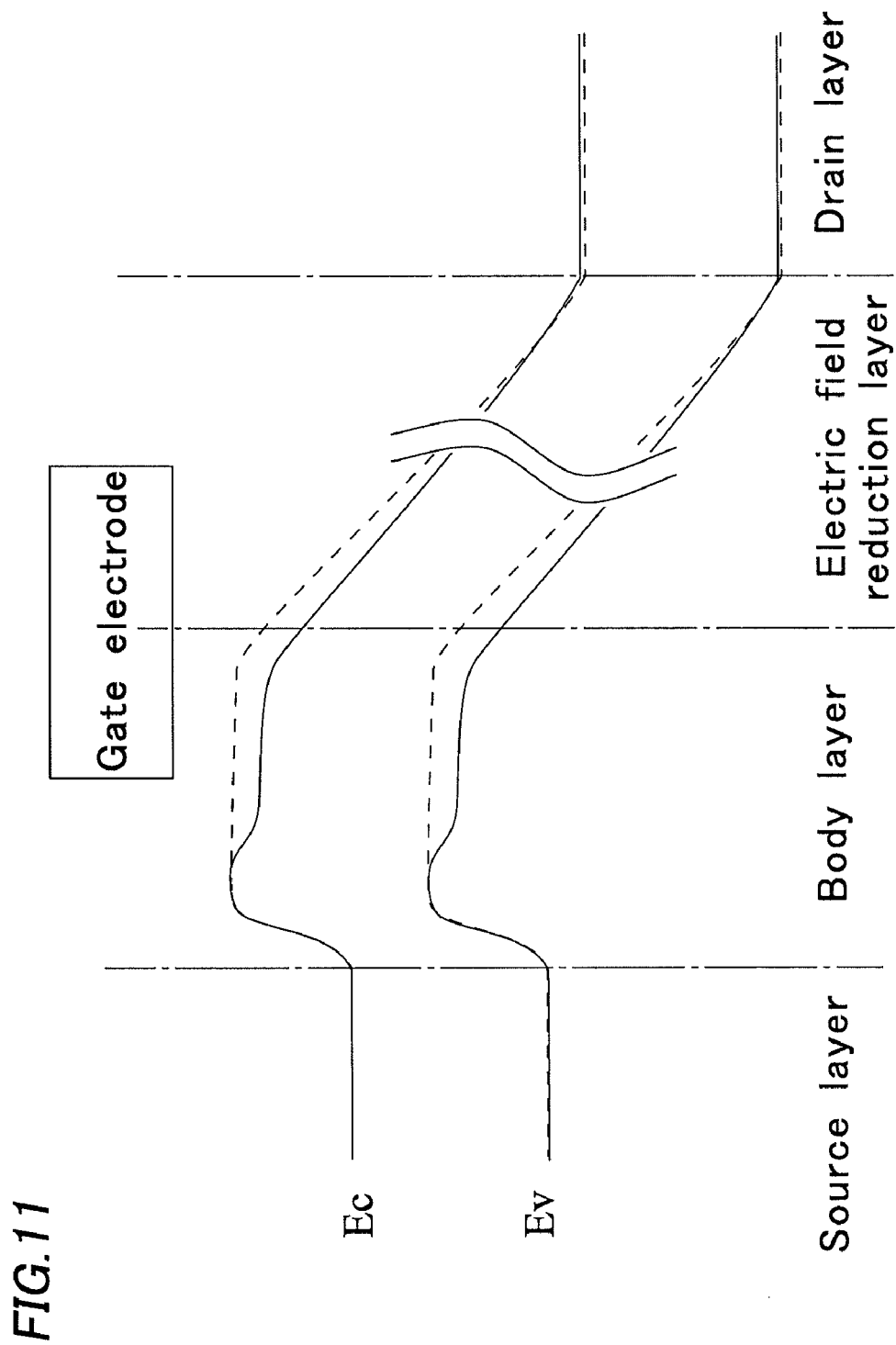
FIG. 11 is a graph schematically showing the energy band state of a parasitic transistor that is formed in a corner portion of the DMOS transistor in the off state in the second embodiment.
Figure 12:
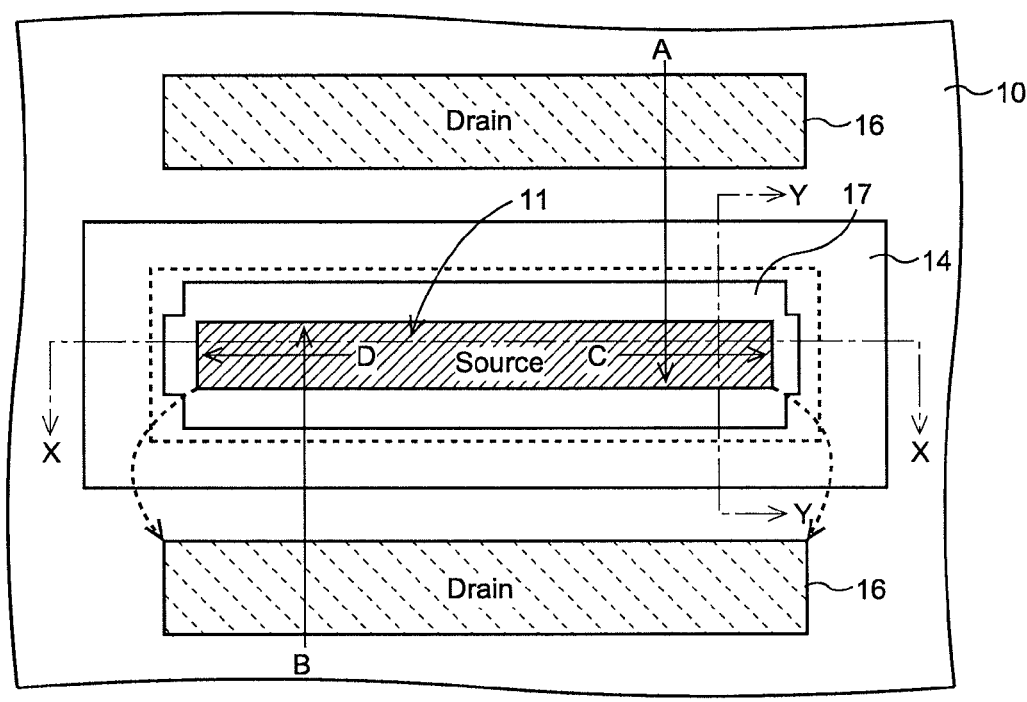
FIG. 12 is a plan view for explaining a conventional DMOS transistor and a conventional method of manufacturing the same.
Figure 13:
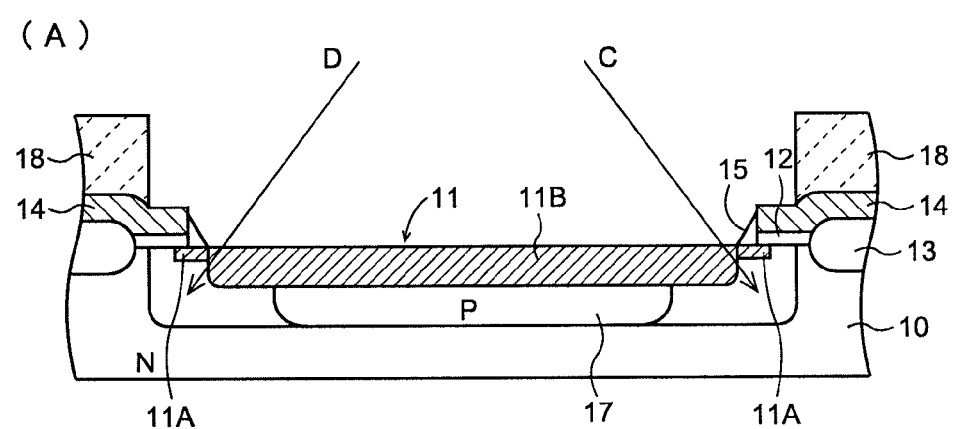
FIG. 13 is cross-sectional views of the DMOS transistor of FIG. 12.
Figure 13:
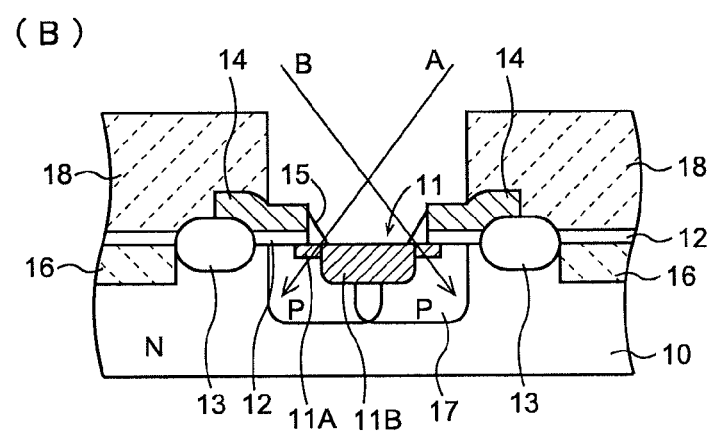

FIG. 11 schematically shows the energy band state of a parasitic transistor that is formed in the corner portion of the DMOS transistor in the off state in the second embodiment. As shown in FIG. 11, the impurity concentration of the body layer 17 abutting on the source layer 11 is the same as that in the normal portion, and thus the energy barrier of the body layer 17 relative to the source layer 11 is the same as that in the normal portion. Furthermore, since the gate electrode 14 does not exist on the source layer 11 side of the body layer 17 including this region, an inversion layer is not formed in this region. As a result, the parasitic transistor in the corner portion is completely prevented from operating. This realizes decreasing the impurity concentration in the normal portion to about $10^{18}/cm^3 \sim 10^{19}/cm^3$ when the thickness of the gate insulation film 12 is 7 nm. This realizes setting the threshold voltage of the DMOS transistor at 1 V or less, and thus a still lower threshold voltage and lower on-resistance are achieved.

Furthermore, in addition to the structure described above, as shown in FIG. 9, the ends of the drain layer 16 formed for the source layer 11 are preferably aligned with the ends of the source layer 11 that is disposed apart from the corner portions of the gate electrode 14. The source layer 11 and the drain layer 16 are tetragonal in a plan view. The widths of the source layer 11 and the drain layer 16 are thus the same, and this prevents a source-drain electric current that flows when the transistor turns on from being concentrated on the corner portions of the gate electrode 14, and enhances the strength of the transistor against breakdown by current concentration (e.g. electrostatic breakdown), the hot carrier reliability, etc.

The invention is not limited to the embodiments described above, and modifications are possible within the scope of the invention. For example, while the oblique ion implantations for forming the body layer 17 are performed after the source layer 11 is formed in the first and second embodiments, these may be performed after the gate electrode 14 is formed and before the source layer 11 is formed.

Furthermore, although an N channel type DMOS transistor is formed on the front surface of the N type semiconductor substrate 10 in the first and second embodiments, an N type epitaxial semiconductor layer may be formed on a P type semiconductor substrate and an N channel type DMOS transistor may be formed on the front surface of this epitaxial semiconductor layer.

Furthermore, an N channel type DMOS transistor is described in the first and second embodiments, the invention is applicable to a P channel type DMOS transistor by changing the conductive types of the source layer 11, the drain layer 16 and the body layer 17 to the opposite conductive types.

What is claimed is:

1. A method of manufacturing a DMOS transistor, comprising:
   providing a semiconductor substrate;
   forming a source layer of a first conductive type in a front surface of the semiconductor substrate;
   forming a gate insulation film on the front surface of the semiconductor substrate;
   forming a gate electrode on the gate insulation film so, as to surround in plan view of the semiconductor substrate the source layer to leave an opening having a corner portion in the gate electrode;
   forming a body layer of a second conductive type superposed on the source layer so as to extend under the gate electrode; and
   forming a drain layer of the first conductive type in the front surface of the semiconductor substrate,
   wherein the opening is elongated in a first direction, and
   the forming of the body layer comprises performing ion implantation of impurities of the second conductive type by directing an ion beam so that in plan view of the semiconductor substrate the ion beam is oblique relative to the first direction and relative to a direction perpendicular to the first direction.

2. The method of claim 1, wherein the ion beam is oblique by a first angle relative to a vertical direction to the front surface of the semiconductor substrate and by a second angle relative to the first direction, the first angle ranging from 20° to 45° and the second angle ranging from 15° to 40°.

3. The method of claim 1, wherein the source layer is formed apart from the corner portion in plan view of the semiconductor substrate.

4. The method of claim 3, wherein the drain layer is formed so as to have ends aligned with ends of the source layer.

5. The method of claim 1, wherein the ion beam is oblique by a first angle relative to a vertical direction to the front surface of the semiconductor substrate and by a second angle relative to the first direction, the first angle ranging from 20° to 45° and the second angle ranging from 50° to 75°.

6. A DMOS transistor comprising:
   a semiconductor substrate;
   a source layer of a first conductive type formed on a front surface of the semiconductor substrate;
   a gate insulation film formed on the front surface of the semiconductor substrate;
   a gate electrode formed on the gate insulation film so as to surround in plan view of the semiconductor substrate the source layer to leave an opening not occupied by the source layer and having a corner portion in the gate electrode;
   a body layer of a second conductive type superposed on the source layer so as to extend under the gate electrode; and
   a drain layer of the first conductive type formed in the front surface of the semiconductor substrate,
   wherein an impurity concentration of the body layer is lower at the corner portion than at other edge portions of the opening, and the source layer is apart from the corner portion in plan view of the semiconductor device.

7. The DMOS transistor of claim 6, wherein ends of the drain layer are aligned with ends of the source layer.

8. The DMOS transistor of claim 6 wherein only one source layer exists in the opening of the gate electrode.

* * * * *